United States Patent [19]

Frick et al.

[11] Patent Number: 4,791,352

[45] Date of Patent: Dec. 13, 1988

[54] TRANSMITTER WITH VERNIER MEASUREMENT

[75] Inventors: Roger L. Frick, Chanhassen; John P. Schulte, Eden Prairie, both of Minn.

[73] Assignee: Rosemount Inc., Eden Prairie, Minn.

[21] Appl. No.: 887,603

[22] Filed: Jul. 17, 1986

[51] Int. Cl.$^4$ ............................................. G01R 27/26

[52] U.S. Cl. ................................ 324/60 CD; 73/718; 73/724; 324/60 C; 340/870.16

[58] Field of Search ..................... 324/60 C, 60 CD; 73/718, 724, 722, 780, 716; 340/870.16

[56] References Cited

U.S. PATENT DOCUMENTS

| | | | |
|---|---|---|---|
| 3,518,536 | 6/1970 | Lee et al. | 324/57 |
| 3,564,923 | 2/1971 | Nudd, Jr. et al. | 73/722 X |
| 3,731,072 | 5/1973 | Johnston | 235/151.3 |
| 4,001,813 | 1/1977 | Kosakowski | 340/347 R |
| 4,054,833 | 10/1977 | Briefer | 324/60 C |
| 4,091,683 | 5/1978 | Delatorre | 73/718 |
| 4,129,863 | 12/1978 | Gray et al. | 340/347 AD |
| 4,145,619 | 3/1979 | Tseng | 307/118 |
| 4,149,231 | 4/1979 | Bukosky et al. | 363/59 |
| 4,165,483 | 8/1979 | Holdren et al. | 324/60 C |
| 4,187,459 | 2/1980 | Wolfendale | 324/60 C |
| 4,187,460 | 6/1980 | Dauge et al. | 324/60 CD |
| 4,193,063 | 3/1980 | Hitt et al. | 340/200 |
| 4,200,863 | 4/1980 | Hodges et al. | 340/347 AD |
| 4,370,890 | 2/1983 | Frick | 73/718 |
| 4,381,677 | 5/1983 | Ruesch et al. | 73/718 |
| 4,387,601 | 6/1983 | Azegami | 73/724 |
| 4,459,856 | 7/1984 | Ko et al. | 73/754 |
| 4,467,655 | 8/1984 | Lee | 73/724 |
| 4,535,283 | 8/1985 | Rabinovich et al. | 323/365 |
| 4,550,295 | 10/1985 | Sasaki | 333/19 |
| 4,570,490 | 2/1986 | Antonazzi | 73/701 |
| 4,574,250 | 3/1986 | Senderowicz | 330/258 |
| 4,633,168 | 12/1986 | Venema | 324/60 CD |

FOREIGN PATENT DOCUMENTS 200119 11/1983 Japan ....................... 73/724

OTHER PUBLICATIONS

Hauser, Max W. et al., "Circuit and Technology Considerations for MOS Delta-Sigma A/D Converters," 1986 *IEEE International Symposium on Circuits and Systems*, May 5-7, 1986, (San Jose, Calif.), pp. 1310-1315.

Robert J. et al., "A Low-Voltage High Resolution CMOS A/D Converter with Analog Compensation," *CICC '86 Conference*, May 12-15, 1986.

Candy, James C., "A Use of Double Integration in Sigma Delta Modulation," *IEEE Transactions on Communications*, vol. Com-33, No. 3, Mar. 1985.

Rose, Craig D., "A New Way to Cut the Cost of A--to-D Converters," *Electronics*, pp. 42-44, Mar. 31, 1986.

Suarez, Ricardo E. et al., "All-MOS Charge Redistribution Analog-to-Digital Conversion Techniques—Part II," reprinted from *IEEE J. Solid-State Circuits*, vol. SC-10, pp. 379-385, Dec. 1975.

Landsburg, George, "A Charge-Balancing Monolithic A/D Converter," reprinted from *IEEE J. Solid-State Circuits*, vol. SC-12, pp. 662-673, Dec. 1977.

McCharles, Robert H. et al., "An Algorithmic Analog-to-Digital Converter," reprinted from *IEEE International Solid-State Circuits Conference Digest of Technical Papers*, pp. 96-97, 1977.

Gregorian, Roubik et al., "Switched-Capacitor Circuit Design," *IEEE*, vol. 71, No. 8, Aug. 1983.

Williams, Jim, "Digitize Transducer Outputs Directly at the Source," *EDN*, Jan. 10, 1985, pp. 201-208.

Williams, Jim, "Monolithic CMOS-Switch IC Suits Diverse Applications," *EDN*, Oct. 4, 1984, pp. 183-194.

*Primary Examiner*—Reinhard J. Eisenzopf
*Assistant Examiner*—Robert W. Mueller
*Attorney, Agent, or Firm*—Kinney & Lange

[57] ABSTRACT

A transmitter provides an output representative of a parameter. A generating circuit in the transmitter senses the parameter and provides charge packets having adjustable magnitudes to a measurement circuit. The measurement circuit measures the quantity of charge and provides a measurement signal representing the charge to a feedback circuit. The feedback circuit is controlled by the measurement signal and provides timed feedback signals to the generating means. The feedback signals control the generation and magnitude of the charge packets such that the charge coupled to the measurement circuit is finely balanced in a short measurement interval. The feedback means counts the number of charge packets provided during a measurement interval such that the numbers counted are representative of the sensed parameter.

22 Claims, 7 Drawing Sheets

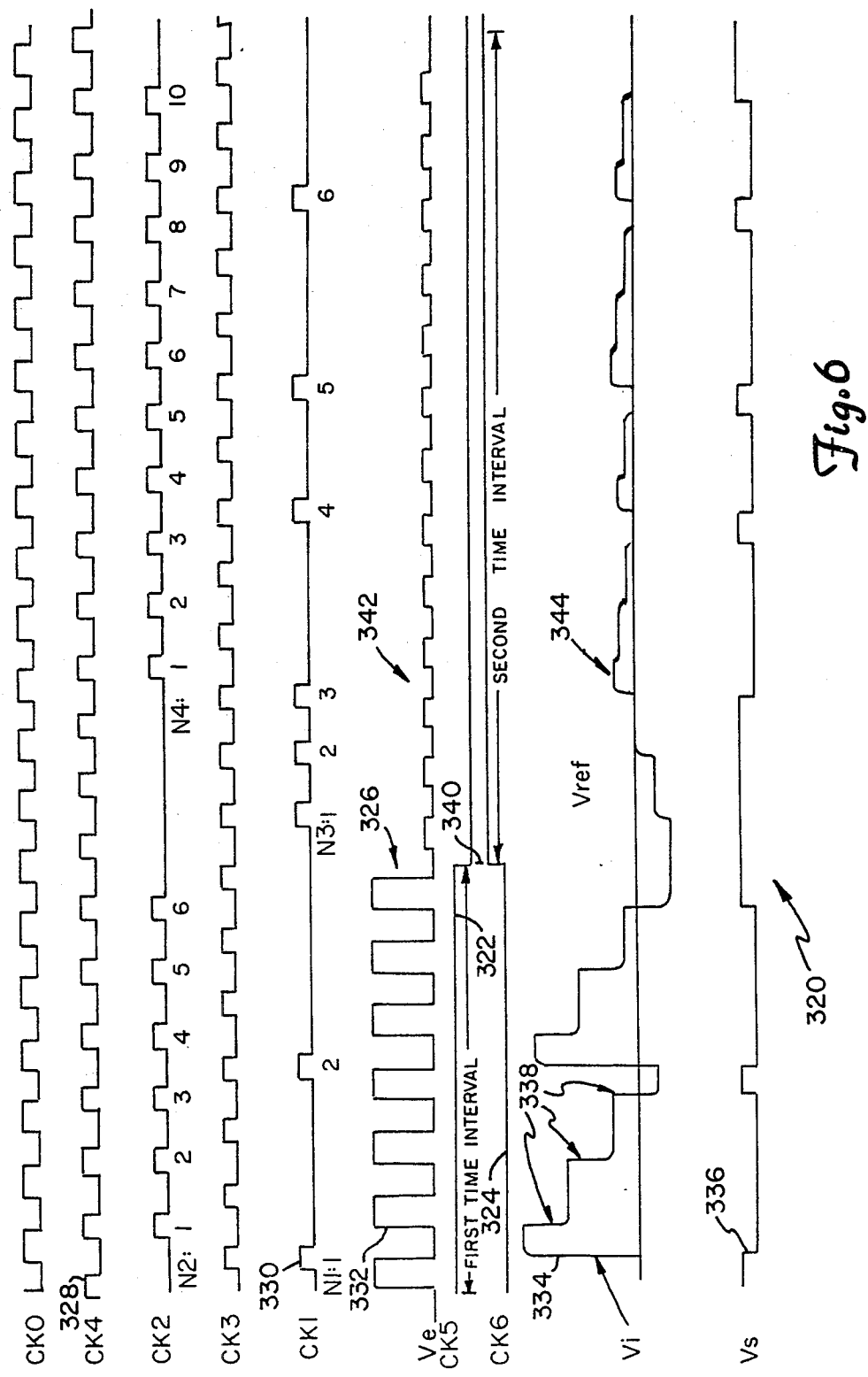

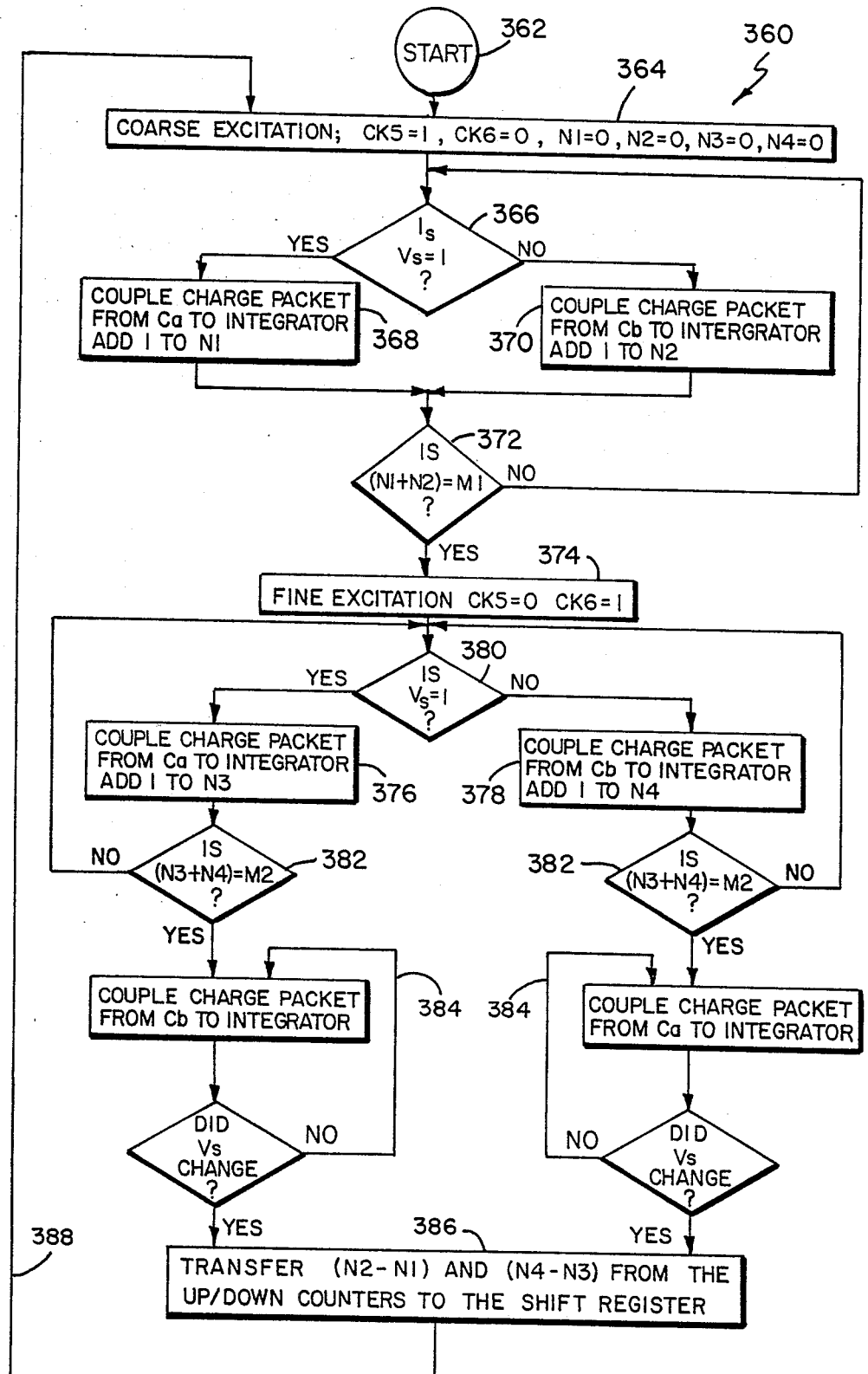

TRANSMITTER WITH VERNIER MEASUREMENT

CROSS-REFERENCE TO RELATED APPLICATION

Reference is hereby made to our co-pending application Ser. No. 855,178 filed Apr. 23, 1986.

BACKGROUND OF THE INVENTION

Field of the Invention

This invention relates to a transmitter for providing an output representative of a parameter.

SUMMARY OF THE INVENTION

A transmitter senses a parameter, such as a pressure, and provides an output representative of the sensed parameter. The transmitter comprises generating means coupled to sense the parameter. The generating means comprise reactance means coupled to the sensed parameter. The generating means generate a quantity of charge packets having adjustable magnitudes and provides a generator signal comprising the charge packets. The generator signal is responsive to the sensed parameter. The transmitter further comprises measurement means coupled to the generating means for measuring the generator signal as a function of the reactance means. The measurement means provide a measurement signal as a function of the reactance means. The transmitter further comprises feedback means coupled to the measurement means. The feedback means provide a feedback signal to the generating means as a function of the measurement signal. The feedback means comprise adjustment means for adjusting the magnitudes of the charge packets such that the output is an improved representation of the sensed parameter. The feedback means provide an output signal representative of the quantities of charge packets generated in a measurement interval.

BRIEF DESCRIPTION OF THE DRAWINGS

FIG. 6 is a timing diagram corresponding to the feedback means of FIG. 5;

FIG. 7 is a flow chart corresponding to the feedback means of FIG. 5.

DETAILED DESCRIPTION OF THE PREFERRED EMBODIMENTS

The circuitry described herein is an improvement to circuitry described in our co-pending application entitled "Measurement Circuit", Ser. No. 855,178 filed Apr. 23, 1986 assigned to the same assignee as this application and incorporated herein by reference.

Figure 1:
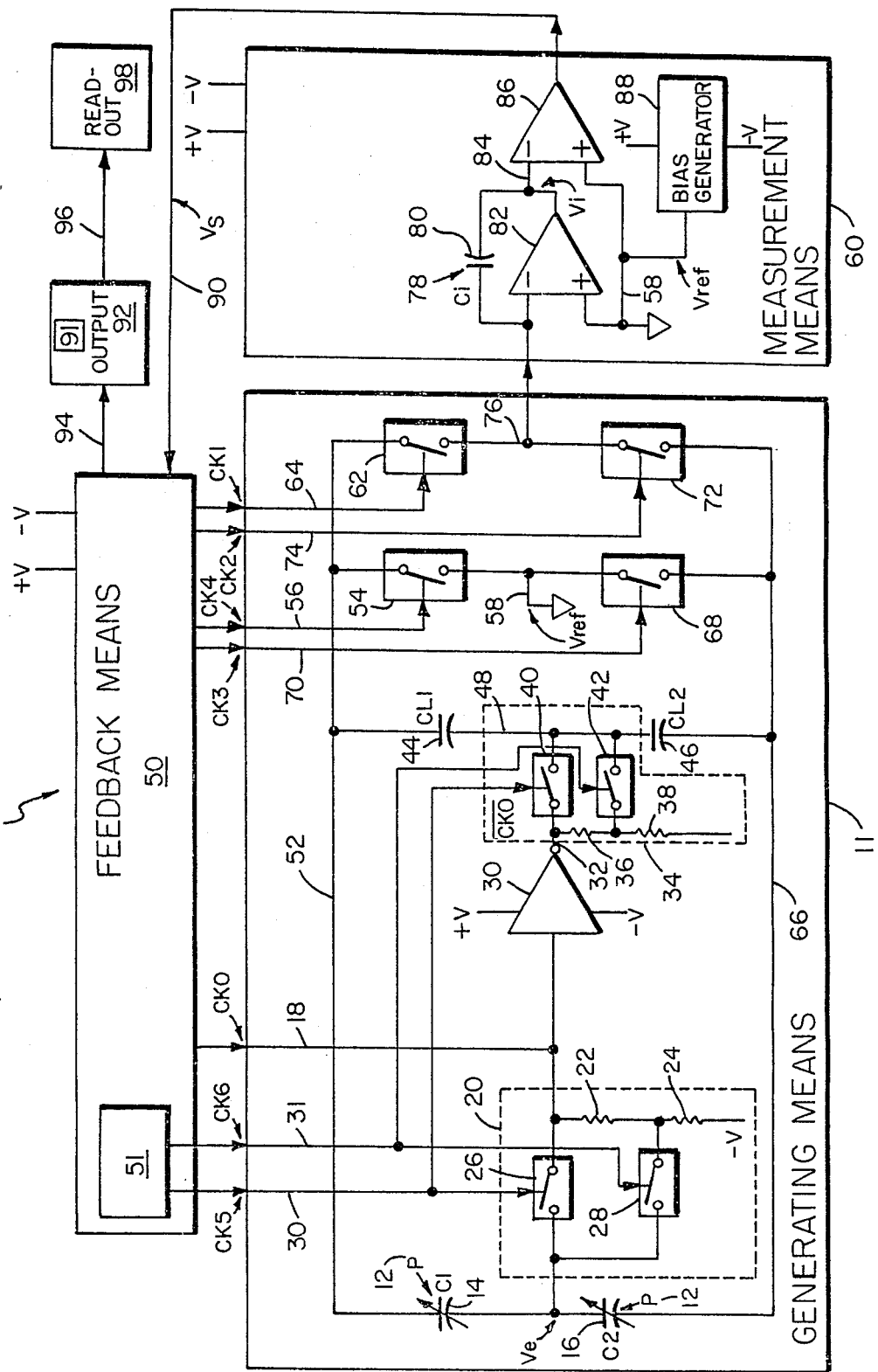
FIG. 1 is a diagram of an embodiment of a transmitter according to this invention.

In FIG. 1, an embodiment of a transmitter is indicated generally at 10. Generating means 11 in the transmitter 10 senses a parameter "P" indicated at 12 and generate quantities or packets of charge representative of the parameter P. The term "packet" refers to a discrete amount of electrical charge which flows to or from a capacitance when it is charged from a first potential to a second potential, different from the first potential. The amount of charge in a packet is proportional to the capacitance and the difference between the first and second potentials. The packets of charge are coupled on line 76 to measurement means 60 in the transmitter 10. The measurement means 60 accumulate the packets of charge coupled on line 76 and provides a measurement signal "Vs" on line 90 as a function of the accumulated charge. The measurement signal on line 90 is coupled to and controls feedback means 50 in the transmitter. The feedback means 50 couple feedback signals to the generating means 11 along lines 18, 30, 31, 56, 64, 70 and 74 for controlling the generation of charge packets by the generating means 11. The feedback means 50 comprise adjustment means 51 for controlling the magnitude of the charge packets coupled on line 76. The adjustment means 51 couple feedback signals CK5 and CK6 along lines 30 and 31 respectively to vernier networks 20 and 34 in the generating means 11. The adjustment means 51 control the vernier networks 20 and 34 to adjust levels of excitation and hence the magnitude of charge packets produced by generating means 11. During a first time interval, the adjustment means 51 control the generating means 11 such that the generating means 11 generate larger packets of charge. The charge packets generated during the first time interval provide a coarse adjustment of the amount of charge accumulated by the measurement means 60. During a second time interval, different from the first time interval, the adjustment means 51 control the generating means 11 such that the generating means 11 generate smaller packets of charge. The smaller charge packets generated during the second time interval provide a fine adjustment of the amount of charge accumulated by the measurement means 60. The generation of the larger packets of charge by the generating means 11 during a first time interval followed by the generation of smaller packets of charge during the second time interval causes the accumulated charge in measurement means 60 to converge to a finely adjusted level in a short cycle time. There is a charge balancing interaction between the generating means 11, the measurement means 60 and the feedback means 50. The quantities or numbers of larger and smaller charge packets are representative of the sensed parameter P. The feedback means 50 counts the numbers of smaller and larger charge packets coupled from the generating means 11 to the measurement means 60 and provide a signal representative of the numbers of smaller and larger charge packets to an output means 92 along line 94. The output means 92 couples an output signal representative of the parameter P on line 96 to readout means 98. Alternatively, the output means 92 can receive the output signal on line 94 and be a means for coupling an analog output, a serial digital output, or a combined analog and digital output to the readout means 98. The vernier adjustment of excitation amplitudes in the generating means 11 provides a preferred fast, accurate output on line 96.

In FIG. 1, the parameter 12 such as a pressure is coupled to a capacitive pressure sensor in a generating means 11 comprising variable capacitor 14 having a capacitance C1 and variable capacitor 16 having a capacitance C2. The capacitances C1 and C2 vary as a function of the sensed parameter P. The feedback means 50 couple an excitation potential CKO varying with time on line 18 through the vernier network 20 to the capacitors 14 and 16. The excitation potential CKO couples to a resistive voltage divider in the vernier network 20 comprising resistors 22 and 24 coupled in series between line 18 and a reference potential −V. The voltage divider generates a second excitation potential at the junction of resistors 22 and 24 and this second excitation potential thus varies with time in the same manner as excitation potential CKO, but it has a magnitude which is only a selected portion of the magnitude of the excitation signal CKO. Selection of the resistances of resistors 22 and 24 controls the magnitude of the second excitation potential. A switch 26 couples the excitation potential CKO from line 18 to the capacitors 14 and 16. A switch 28 couples the second excitation potential from the voltage divider compriiing resistors 22 and 24 to the capacitors 14 and 16. The feedback means 50 couples a signal CK5 along a line 30 to the switch 26 to control switch 26. The feedback means 50 couples a signal CK6 along a line 31 to the switch 28 to control switch 28. The feedback means 50 controls the switches 26 and 28 to conduct in a non-overlapping manner such that either the excitation potential CKO or the second excitation potential is coupled to the capacitors 14 and 16 to provide excitation thereof. Switches are preferably MOS transmission gates. These MOS transmission gates are designed to have a structure which provides for very low leakage currents when they are open and which transfers a minimal amount of parasitic charge from the gate when switched. Desired MOS transmission gate characteristics are a leakage current of less than 1 pico ampere in an "off" state and a charge transfer of less than 0.05 pico coulombs when switched. Each of the switches is closed to couple signals by application of a high or "1" level, and is opened to stop coupling signals by application of a low or "0" level to the control input or gate of the switch. The vernier network 20 thus functions as a vernier to provide either a large, coarse excitation or a small fine excitation to the sensing capacitors 14 and 16. Larger packets of charge couple through capacitors 14 and 16 when switch 26 is closed; smaller packets of charge couple through capacitors 14 and 16 when switch 28 is closed. The feedback means 50 thus controls the magnitude of an excitation potential Ve at the junction of capacitors 14 and 16. The vernier adjustment of the excitation amplitude can be alternatively provided using a programmable gain operational amplifier, capacitive voltage divider or other means of providing coarse and fine excitation under the control of feedback means.

The excitation potential CKO further couples along line 18 to an inverter 30 which couples a third excitation potential $\overline{CKO}$ to line 32. The third excitation potential $\overline{CKO}$ is an inverse of the excitation potential CKO and is coupled along line 32 to a second vernier network 34. The second vernier network 34 includes a second resistive voltage divider comprising resistors 36 and 38 coupled in series between line 32 and the reference potential −V. The voltage divider comprising resistors 34 and 36 generates a fourth excitation potential at the junction of resistors 34 and 36 and this fourth excitation potential varies with time in the same manner as the third excitation potential $\overline{CKO}$, but it has a magnitude which is only a selected portion of the magnitude of the third excitation potential $\overline{CKO}$. The excitation potentials CKO and $\overline{CKO}$ preferably have the same peak to peak magnitudes. The resistive voltage divider comprising resistors 22 and 24 preferably has a resistive divider ratio that is substantially the same as a divider ratio of the resistive voltage divider comprising resistors 34 and 36. The adjustment means 51 in the feedback means 50 couples the signal CK5 along the line 30 to a switch 40 for controlling switch 40. The switch 40 couples the third excitation potential $\overline{CKO}$ to a linearity correction capacitor 44 having a selected capacitance CL1 and a linearity correction capacitor 46 having a selected capacitance CL2. The adjustment means 51 in the feedback means 50 couples the signal CK6 along the line 31 to a switch 42 for controlling switch 42. The switch 42 couples the fourth excitation potential to linearity correction capacitors 44 and 46 along line 48. Capacitors 44 and 46 have selected capacitances which compensate the generating means 11 for stray capacitances associated with capacitors 14 and 16. The second vernier network 34 thus couples either a coarse or a fine adjusted excitation potential to the linearity correction capacitors 44 and 46.

Pressure sensing capacitor 14 and linearity correction capacitor 44 couple along line 52 to a switch 54. Feedback means 50 couples a signal CK4 along line 56 to switch 54 to control the switch 54. Switch 54 couples capacitors 14 and 44 to a reference potential Vref on line 58 such that controlled quantities or packets of charge are stored on capacitors 14 and 44. Capacitors 14 and 44 also couple along line 52 to a switch 62 which couples packets of charge stored on capacitors 14 and 44 to the measurement means 60 along line 76. Feedback means 50 couples a signal CK1 along line 64 to switch 62 for controlling switch 62.

Pressure sensing capacitor 16 and linearity correction capacitor 46 couple along a line 66 to a switch 68. Feedback means 50 couples a signal CK3 along line 70 to the switch 68 for controlling switch 68. Switch 68 couples capacitors 16 and 46 to the reference potential Vref on line 58 such that controlled quantities or packets of charge are stored on capacitors 16 and 46. Capacitors 16 and 46 also couple along line 66 to a switch 72. Feedback means 50 couples a signal CK2 along line 74 to the switch 72 for controlling the switch 72. Switch 72 couples packets of charge stored on capacitors 16 and 46 to the measurement means 60 along the line 76.

Measurement means 60 comprises an integrator 78 which accumulates charge coupled from the generating means 11 along line 76. Integrator 78 comprises a capacitor 80 having a capacitance Ci coupled between an output and an inverting input of an amplifier 82. The integrator 78 couples a potential Vi representative of accumulated charge to an inverting input of a comparator 86 along line 84. A bias generator 88 in the measurement means 60 is energized from reference potentials +V and −V and is preferably a CMOS voltage divider. The bias generator 88 couples a reference potential Vref along line 58 to a positive input of the comparator 86, to a positive input of amplifier 82 and to switches 54 and 68 in the generating means 11. The comparator 86 couples the measurement signal Vs on line 90 to the feedback means 50. The measurement signal Vs is indicative of a level of charge stored on capacitor 80 in integrator 78. The measurement signal Vs on line 90 controls the operation of the feedback means 50.

Figure 2:
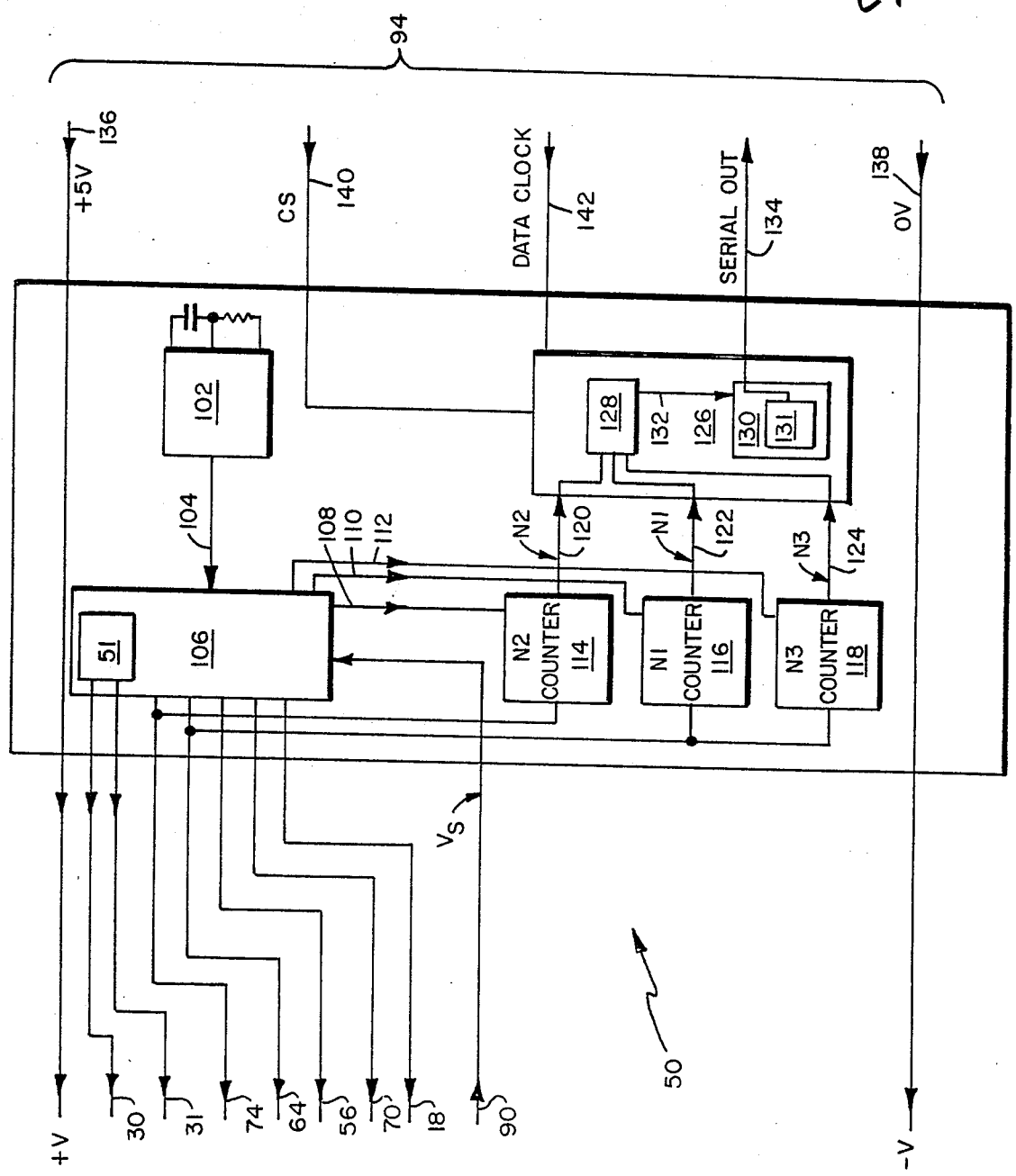
FIG. 2 is a diagram of a first embodiment of a feedback means according to this invention.

In FIG. 2, a first embodiment of the feedback means 50 of FIG. 1 is shown. The feedback means 50 comprises an oscillator 102 coupling an oscillator signal along a line 104 to an excitation logic circuit 106. The oscillator signal clocks circuitry in the excitation logic circuit 106 to provide timing. The excitation logic circuit 106 couples feedback signals to the generating means 11 on lines 56, 64, 70, 74 and 18 which are timed by the oscillator signal and controlled by the measurement output Vs on line 90 in a desired manner. The excitation logic circuit 106 comprises an adjustment means 51 which couples feedback signals to lines 30 and 31. Adjustment means 51 provides selection of larger or smaller charge packets as explained above in connection with FIG. 1. The excitation logic circuit 106 couples counter control signals on lines 108, 110 and 112 to pulse counters 114, 116 and 118 respectively in the feedback means 50. The counter control signals control the enabling and resetting of the counters 114, 116 and 118. Counter 114 is coupled to line 74 for counting the number of pulses N2 on line 74 during the first time interval. Counter 116 is coupled to line 64 for counting the number of pulses N1 on line 64 during the first time interval. Counter 118 is coupled to line 64 for counting the number of pulses N3 on line 64 during the second time interval. The numbers of pulses counted, N1, N2 and N3 are together representative of the sensed parameter. Counters 114, 116 and 118 couple signals representative of the numbers N2, N1 and N3 along lines 120, 122 and 124 respectively to a circuit 126. Circuit 126 comprises a computing circuit 128 for computing a value of the sensed parameter P from the signals on lines 120, 122 and 124. The computing circuit 128 couples a signal representative of the computed value on line 132 to a circuit 130 comprising a shift register 131. Circuit 130 converts the parallel data signal on line 132 to a serial form and couples a serial signal representative of the sensed parameter out on line 134. The feedback means 50 couples to a 5-line data bus 94 for interfacing with a microprocessor 91 in the output means 92. The 5-line data bus 94 couples energization potentials on lines 136 and 138 to the transmitter 10. The 5-line data bus couples a chip select signal on line 140 and a data clock signal on line 142 for synchronizing the operation of a shift register in circuit 130 with the microprocessor in the output means 92.

Figure 3:
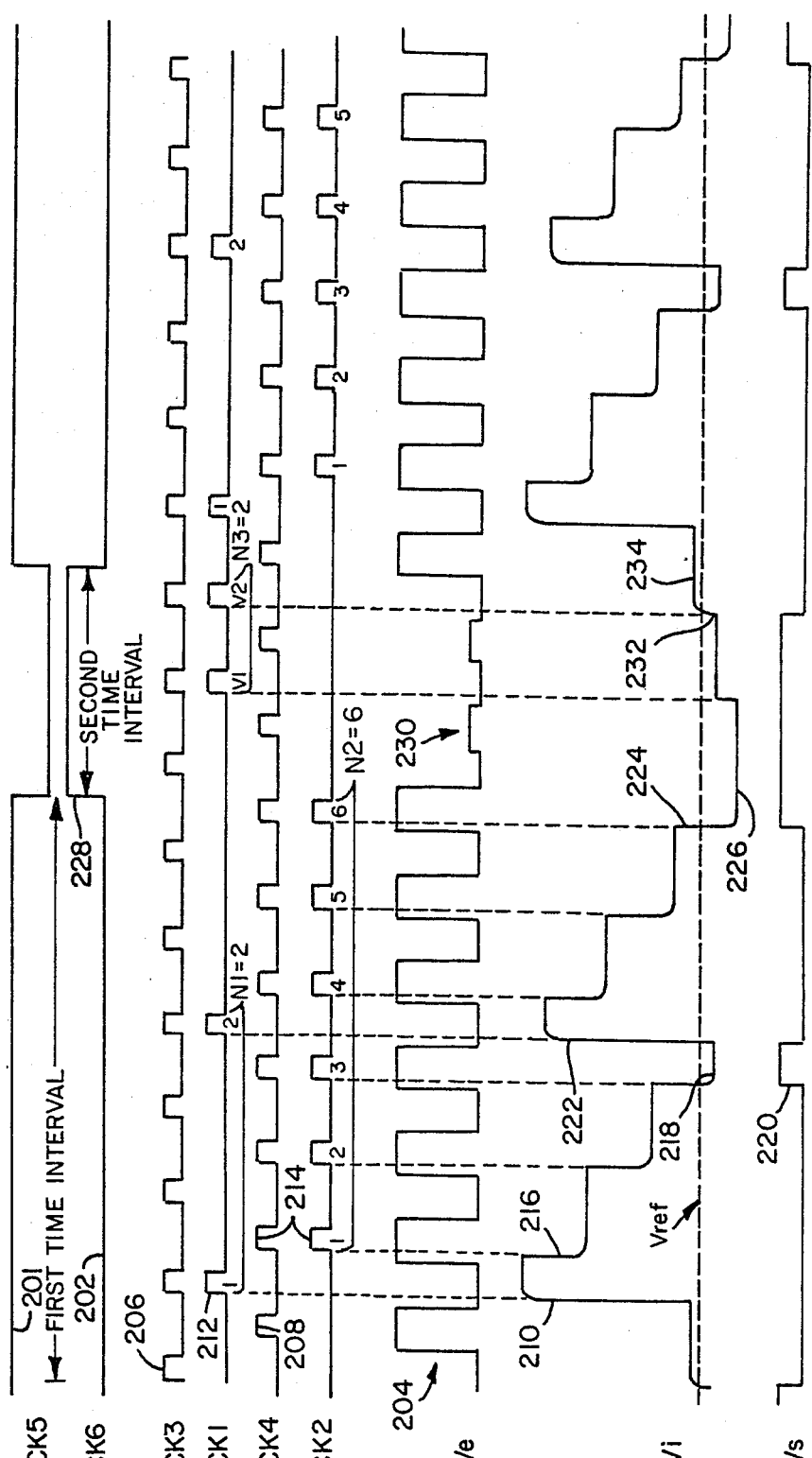
FIG. 3 is a timing diagram corresponding to the feedback means of FIG. 2.

In FIG. 3, a timing diagram 200 is shown which corresponds to the first embodiment of the feedback means 50 shown in FIG. 2. During a first time interval shown in FIG. 3 the feedback signal CK5 at 201 is at a high or "1" level, closing switches 26 and 40, and the feedback signal CK6 at 202 is at a low or "0" level, opening switches 28 and 42. The vernier network 20 thus provides an excitation potential Ve at a higher magnitude as shown at 204. The excitation level from vernier network 34 is likewise at a higher magnitude during the first time interval. The feedback signal CK3 is actuated as shown at 206 to close switch 68, thus storing packets of charge on capacitors 16 and 46. After the excitation signal Ve changes polarity, the feedback signal CK4 is actuated as shown at 208, thus closing switch 54 and storing packets of charge on capacitors 14 and 44. After the excitation potential Ve again changes polarity, the feedback signal CK1 is actuated as shown at 212 to close switch 62 and couple a packet of charge on line 76 to the integrator 78. The integrator signal Vi responds to the packet of charge as shown at 210 in FIG. 3. After the excitation potential Ve again changes polarity, the feedback signals CK2 and CK4 are actuated as shown at 214. The actuation of signal CK4 at 214 stores new packets of charge on capacitors 14 and 44; the actuation of signal CK2 at 214 couples charge packets from capacitors 16 and 46 to the integrator 78. The integrator output Vi responds to these packets of charge as shown at 216 in FIG. 3. Charge packets from capacitors 16 and 44 are then repetitively coupled from capacitors 16 and 46 to the integrator 78 until the integrator output Vi falls below the reference level Vref as shown at 218. The comparator 86 senses the integrator output change shown at 218 and couples a pulse shown at 220 to the feedback means along line 90. The feedback means senses the level change on line 90 and couples a second charge packet from capacitors 14 and 34 as shown at 222. The feedback means 50 next controls switches in the feedback means such that charge packets from the capacitor 16 and 46 are again repetitively applied to the integrator until the integrator output falls below the reference level as shown at 224. After a selected number (N1+N2) of charge packets from capacitors 14, 16, 44 and 46 have been coupled to the integrator 78 the quantity of charge coupled to the integrator 78 is coarsely balanced. The feedback means then actuates the feedback signal CK6 thus ending the first time interval and starting the second time interval as shown at 228.

During the second time interval, switches 28 and 42 are closed and hence a lower magnitude of excitation Ve as shown at 230 is coupled to the sensing capacitor 14 and 16 from the vernier network 20. The excitation provided by vernier network 34 is likewise at a lower magnitude. In the example shown in FIG. 3, the lower magnitude of excitation is shown at 230 to be about ⅛ of the higher level of excitation at 204. During the second time interval, a number N3 of lower magnitude packets of charge are coupled from the capacitors 14 and 44 as shown at 232 until the charge on the integrator is finely balanced to near the reference level as shown at 234.

The balancing of charge at the integrator 78 during the first and second time intervals results in a relationship as shown in Equation 1 below:

$$(N1)(Ca)(Ve)+(N3)(Ca)(Ve)/N=(N2)(Cb)(Ve) \qquad \text{Equation 1}$$

where:

N1 = the number of larger charge packets coupled from capacitors 14 and 44 during the first time interval;

N2 = the number of larger charge packets coupled from capacitors 16 and 46 during the first time interval;

N3 = the number of smaller charge packets coupled from capacitors 14 and 44 during the second time interval;

N = the divider ratio of the higher to the lower excitation magnitudes;

Ca = C1 − CL1, a value of C1 corrected for linearity;

Cb = C2 − CL2, a value of C2 corrected for linearity;

Ve = the higher excitation magnitude.

A long term average value of the numbers of charge packets tends toward an accurate value representative of the sensed parameter because small accumulations of charge packets in the measurement means 60 are not zeroed out and lost at the end of a measurement period, but are instead carried forward to affect a succeeding measurement interval.

Equation 1 can be simplified to form Equation 2 below:

$$\frac{Cb}{Ca} = \frac{(N1)+(N3)/(N)}{N2} \qquad \text{Equation 2}$$

In a dual plate capacitive pressure transducer, the sensed pressure P is related to the corrected sensor capacitances Equation 3:

$$P = \frac{K(1 - (Cb/Ca))}{1 + (Cb/Ca)} \quad \text{Equation 3}$$

where K is a scaling factor. Equations 2 and 3 can be combined to form Equation 4:

$$P = K\frac{(N2) - (N1) - (N3/N)}{(N2) + (N1) + (N3/N)} \quad \text{Equation 4}$$

Hence it can be seen that the pressure P is dependent on the numbers N1, N2, N3 and N and can be substantially independent of the reference potentials and ambient temperature of the transmitter over an operating range.

Computing means 128 calculates a signal representative of pressure according to Equation 4 and couples the signal representative of pressure on line 132 to circuit 130.

Figure 4:
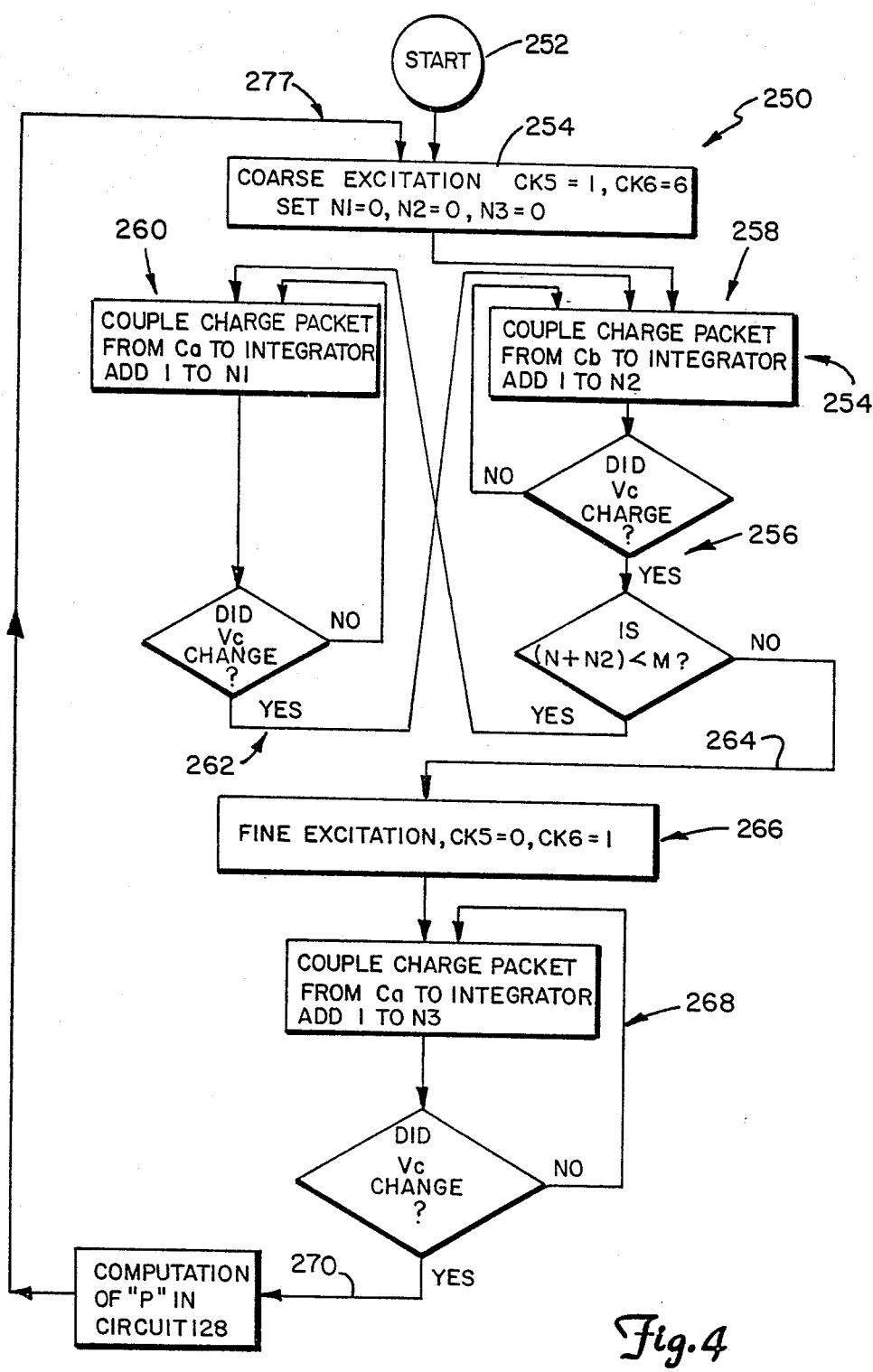
FIG. 4 is a flow chart corresponding to the feedback means in FIG. 2.

In FIG. 4, a flow chart 250 illustrates an exemplary sequence of operation for a transmitter 10 comprising the feedback means 50 as shown in FIG. 2 and corresponding to the timing diagram of FIG. 3. At power up or START at 252, the coarse excitation mode is first selected as shown at 254. The excitation logic circuit then controls the generating means 11 so that it repetitively couples charge packets from capacitance Cb as shown at 254 until the measurement signal Vc changes as shown at 256. If the number (N1+N2) is less than a preselected number M, the excitation logic circuit 106 then leaves a right loop 258 and starts a left loop 260. In the left loop 260, the excitation logic circuit 166 controls the generating means 11 to repetitively couple charge packets from capacitance Ca until the measurement output Vc changes as shown at 262.

The excitation logic circuit 106 controls the generating means 11 so that the generating means 11 alternates between coupling charge packets from Ca and coupling charge packets from capacitance Cb until the quantity (N1+N2) equals or exceeds M as shown at 264, at which time the excitation logic circuit 106 switches from the coarse excitation mode (first time interval) to the fine excitation mode (second time interval) as shown at 266.

During the second time interval, the excitation logic circuit 106 controls the generating means 11 such that smaller charge packets are coupled from capacitance Ca to the measurement means 60 as shown at 268 until the measurement output Vc changes as shown at 270. The numbers N1, N2, N3 which are obtained in this sequence are coupled to computing circuit 128 and then this sequence is repeated again starting at 272.

In the embodiment illustrated in FIG. 3, the number M of FIG. 4 is set to 8, and the divider ratio N is also set to 8. This arrangement provides a 6-bit resolution in only 10 cycles of the excitation waveform whereas a similar transmitter without the vernier feature requires more than 66 cycles of the excitation waveform to achieve this same 6-bit resolution. The speed of the capacitance-to-digital conversion is thus enhanced by a factor of more than 6 when M and N are 8. Much larger values of M and N can also be selected to achieve even greater resolution. In a practical circuit, M can be set to 256 and N can be set to 256 to achieve 16 bit resolution in 512 cycles of the excitation waveform using the vernier arrangement, giving a factor of 128 improvement over a similar circuit without a vernier.

The transmitter circuitry preferably comprises a MOS integrated circuit coupling to an output circuit to provide a preferred low power consumption. The transmitter circuitry has a preferred low power consumption and can be used in a two-wire, intrinsically safe 4–20 mA loop powered transmitter.

Figure 5:
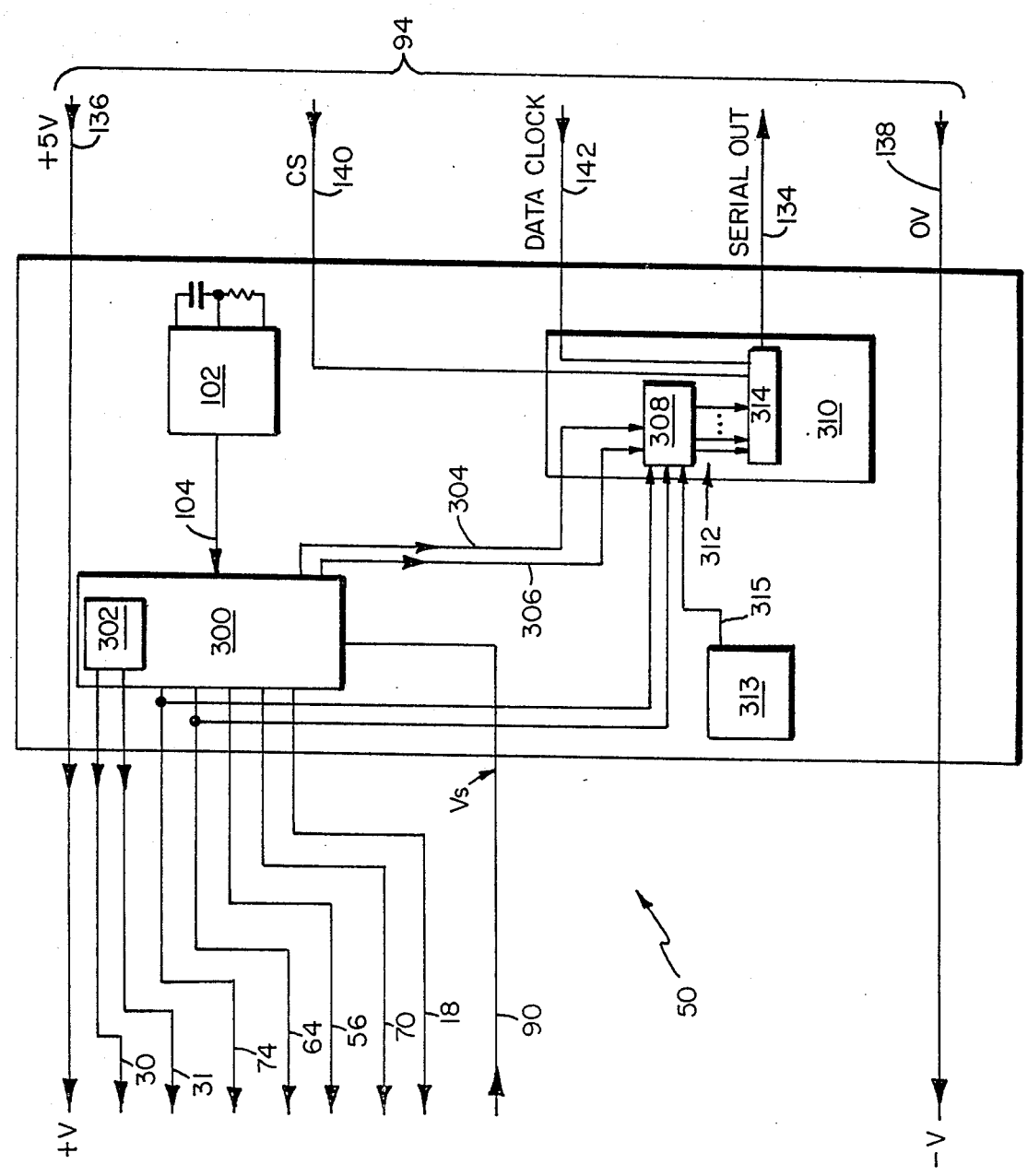
FIG. 5 is a diagram of a second embodiment of a feedback means according to this invention.

In FIG. 5, a second embodiment of the feedback means 50 of FIG. 1 is shown. An oscillator 102 couples an oscillator signal along a line 104 to an excitation logic circuit 300. The oscillator signal clocks logic circuitry in the excitation logic circuit 300 to provide timing. The excitation logic circuit 300 couples feedback signals on lines 56, 64, 70, 74 and 18 which are timed by the oscillator signal and controlled by the measurement output Vs on line 90 in a desired manner. The excitation logic circuit comprises an adjustment means 302 which couples feedback signals to lines 30 and 31. Adjustment means 302 provides selection of larger or smaller charge packets as explained above in connection with FIG. 1. The excitation logic circuit 300 couples counter control signals on lines 304, 306 to a counter circuit 308 in a serial output circuit 310. Counter circuit 308 is coupled to lines 64 and 74 for counting numbers of pulses on lines 64 and 74 under the control of counter control signals on lines 304 and 306. The counter circuit 308 couples signals representative of the numbers of pulses counted along lines 312 to a parallel input of a shift register circuit 314 in the serial output circuit 310. The shift register circuit 314 is controlled by a chip select signal on line 140 and a data clock signal on line 142 to couple a serial output to line 134. The serial output on line 134 comprises a signal representative of the numbers of pulses counted on lines 64 and 67. The feedback means 50 of FIG. 5 couples to a 5-line data bus 94 for interfacing with a microprocessor in the output means 92. The 5-line data bus 94 couples energization potentials on lines 136 and 138 to the transmitter 10. A nonvolatile memory 313 can comprise constants which are representative of the characteristics of sensing capacitors 14 and 16. The constants in memory 313 can be coupled along a line 315 to the counter circuit 308 to pre-load the counter circuit 308 with constants so that counting of pulses by counter circuit 308 is adjusted for manufacturing tolerances of the sensing capacitors 14 and 16.

In FIG. 6, an exemplary timing diagram 320 is shown which corresponds to the second embodiment of the feedback means 50 shown in FIG. 5. During a first time interval shown in FIG. 6, the feedback signal CK5 at 322 is at a high or "1" level, closing switches 26 and 40, and the feedback signal CK6 at 324 is at a low or "0" level, opening switches 28 and 42. The vernier network 20 thus provides an excitation potential Ve at a higher magnitude as shown at 326 during the first time interval. The excitation level from vernier network 34 is likewise at a higher magnitude during the first time interval. The feedback signal CK4 is actuated as shown at 328 to close switch 54, thus storing packets of charge on capacitors 14 and 44. The feedback signal CK1 is then actuated at 330 closing switch 62. The excitation signal Ve changes polarity at 332 thus coupling a packet of charge from capacitors 14 and 44 to the measurement means 60 along line 76. The integrator signal Vi increases past the reference voltage Vref in response to this packet of charge as shown at 334. The comparator 86 senses that the integrator signal Vi has increased past the reference potential Vref and the measurement output Vs changes from a "1" to a "0" as shown at 336. The change in the measurement output Vs is coupled along line 90 to the feedback means 50 and the feedback means 50 senses the change and stops coupling charge packets of a first polarity from capacitors 14 and 44 and starts coupling charge packets of opposite polarity from capacitors 16 and 46 to the measurement means 60. The response of the integrator 78 to the charge packets coupled from capacitors 16 and 46 is shown at 338 in FIG. 6. The generating means continues to provide charge packets from capacitors 14 and 44 and from capacitors 16 and 46 as shown in FIG. 6 until a predetermined number M1 of charge packets from both capacitors 14 and 44 and capacitors 16 and 46 have been produced. After the number M1 of charge packets has been produced, the feedback means 50 ends the first time interval and starts the second time interval by changing feedback signal CK5 from a "1" to a "0" and changing feedback signal CK6 from a "0" to a "1" as shown at 340. During the second time interval, the capacitors 14, 44, 16, 46 receive a lower or fine excitation level from vernier circuits 20 and 34 as shown at 342. During the second time interval, the feedback means 50 of FIG. 5 controls the generating means 11 to couple smaller charge packets to the measurement means 60 as shown at 344 in a manner similar to the coupling of larger charge packets during the first time interval. After a predetermined number M2 of smaller charge packets are coupled during the second time interval, the feedback means 50 of FIG. 5 controls the generating means 11 to couple charge packets to the measurement means 78 until the measurement output Vs changes. The integrator output Vi is thus balanced to near the reference level such that the integrator 78 is ready for another measurement sequence. Numbers of charge packets coupled to the measurement means 60 are counted during the measurement interval by the counter circuit 308. The balancing of charge during the measurement interval made up of a first and second time interval results in a relationship as shown in Equation 5 below.

$$P = K \frac{(N2 - N1) + (N4 - N3)/2^N}{(N1 + N2) + (N4 + N3)/2^N} \quad \text{Equation 5}$$

where
P is a pressure related to corrected sensor capacitances as shown in Equation 3 above;
N1 is the number of larger charge packets coupled from capacitors 14 and 44 during a measurement interval;
N2 is the number of larger charge packets coupled from capacitors 16 and 46 during a measurement interval;
N3 is the number of smaller charge packets coupled from capacitors 14 and 44 during a measurement interval;
N4 is the number of smaller charge packets coupled from capacitors 16 and 46 during a measurement interval;
$2^N$ is the divider ratio of the higher to the lower excitation magnitudes; and
K is a scaling factor.

In a preferred embodiment the preselected numbers M1 and M2 and the divider ratio N are selected fixed numbers, and hence the denominator of Equation 5 is a fixed quantity. The circuitry of feedback means 50 does not have to calculate pressure P by dividing by a denominator of Equation 5. The denominator of Equation 5 can thus be included in a scale factor K1 and $P = K1((N2-N1)+(N4-N3)/2^N)$. The quantity $(N2-N1)$ is counted by a first up/down counter in the counter circuit 308. The quantity $(N4-N3)$ is counted by a second up/down counter in the counter circuit 308. The divider ratio N can be selected to be an integral number and hence the $2^N$ denominator of the $(N4-N3)/2^N$ term in the numerator of equation 5 represents merely a shift of the position of the binary equivalent of a decimal point. The outputs of the first and second up/down counter can thus be loaded directly into the shift register circuit 314 without the need for any division or other complex arithmetic calculations in the feedback means 50 of FIG. 5. A digital word is loaded into the shift register which has a higher order byte representing $(N2-N1)$ and a lower order byte representing $(N4-N3)/2^N$.

In FIG. 7, a flow chart 360 illustrates an exemplary sequence of operation for a transmitter 10 comprising a feedback means 50 as shown in FIG. 5 and corresponding to the timing diagram of FIG. 6. At power-up or start 362, the coarse excitation mode is selected and the counters for N1, N2, N3, N4 are preset to zero at 364. Alternatively, the counters can be preset to a non-zero value stored in non-volatile memory 313. Depending on the logic level of Vs at 366, the generating means couples a larger packet of charge from either capacitance Ca or Cb to the measurement means. The count of either N1 or N2 is correspondingly increased by 1 for each charge packet as shown at 368, 370. Charges are repetitively coupled in this manner until the quantity (N1+N2) is equal to the preselected value M1 shown at 372. Once the preselected value M1 is reached, the fine excitation mode is selected at 374. In the fine excitation mode, smaller packet of charge are coupled from either capacitance Ca or Cb to the measurement means as shown at 376, 378, depending upon the logic level of Vs as shown at 380. Charges are repetitively coupled in this manner until the number of fine charge packets (N3+N4) is equal to a second preselected number M2 as shown at 382. Counting of charge packets stops at this point in the sequence, however, additional smaller charge packets are coupled to the integrator to rebalance the integrator and prepare it for the next measurement cycle as shown at 384. The numbers (N2-N1) and (N4-N3) are then transferred from counters to the high and low bytes of the shift register respectively as shown at 386, and a new measurement cycle is begun as shown at 388.

Circuitry for the transmitter 10 preferably comprises an MOS integrated circuit to provide low power consumption. In the example illustrated in FIG. 6, the selected numbers M1=8 and M2=16 are illustrated. A further preferred embodiment uses selected number M1=1024 and M2=320 with a divider ratio of 64 to provide a desired 16 bits of resolution within 1500 oscillator cycles. With 10 microsecond oscillator cycles, a measurement cycle can be completed in 15 milliseconds. An important improvement is obtained over simple single or dual slope A/D converters which would require 64,000 cycles to obtain the 16 bit resolution of the sensed parameter.

What is claimed is:
1. A transmitter for providing an output representative of a sensed parameter, comprising:
generating means for providing a generator signal comprising a plurality of charge packets at least some of which have a magnitude of charge which is a function of the sensed parameter; the generating means including reactance means for forming the charge packets in response to electrical excitation, and means for varying a level of the electrical excitation to the reactance means as a function of a control signal to alter magnitudes of the charge packets;

measurement means coupled to the generating means for measuring the generator signal as a function of the reactance means and for providing a measurement signal as a function thereof;

feedback means coupled to the measurement means for providing a feedback signal to the generating means as a function of the measurement signal and for providing an output signal representative of the quantity of charge packets, the feedback means inclduing adjustment means coupled to the generating means for providing the control signal to selectively vary the level of the electrical excitation to the reactance means to vary sensitivity of the transmitter to the sensed parameter such that the output is an improved representation of the sensed parameter.

2. A transmitter as recited in claim 1 wherein the means for varying couples a first level of excitation to the reactance means during a first time interval and couples a second level of exictation, different from the first level, to the reactance means during a second time interval, different from the first time interval.

3. A transmitter as reciter in claim 2 wherein the second level of excitation has a smaller magnitude than the first level of excitation.

4. A transmitter as recited in claim 1 wherein the reactance means comprises a capacitive sensor.

5. A transmitter as recited in claim 4 wherein the sensed parameter is a pressure coupled to the capacitive sensor.

6. A transmitter as recited in claim 7 wherein the means for varying comprises divider means coupled to the capacitive sensor for providing the first and second levels of excitation.

7. A transmitter as recited in claim 6 wherein the means for varying further comprises switching means coupled to the divider for selectively coupling the first and second levels of excitation to the capacitive sensor.

8. A transmitter as recited in claim 7 wherein the generating means further comprise correction means coupled to the reactance means for correcting for stray reactance.

9. A transmitter as recited in claim 8 wherein the feedback means comprises counter means coupled to a feedback signal for counting a number of charge packets coupled to the measurement means during a time interval.

10. A transmitter as recited in claim 6 wherein the output is a 4–20 milliampere current.

11. A transmitter as recited in claim 10 wherein the transmitter is energized by the output current.

12. A transmitter as recited in claim 1 wherein the output is a function of the number of charge packets coupled from the generating means to the measurement means during the first and second time intervals.

13. A transmitter as recited in claim 12 wherein the output P is calculated substantially by tyhe feedback means as $$P = K \frac{(N2) - (N1) - (N3/N)}{(N2) + (N1) + (N3/N)}$$

where K is a proportionality constant, N is a divider ratio of the divider means, N1 and N2 are numbers of charge packets coupled to the measurement means during the first time interval and N3 is a number of charge packets coupled to the measurement means during the second time interval.

14. A transmitter as recited in claim 12 wherein the output P is calculated by the feedback means substantially as $$P = K \frac{(N2 - N1) + (N4 - N3)/2^N}{(N1 + N2) + (N4 + N3)/2^N}$$

where K is a proportionality constant, $2^N$ is a divider ratio of the divider means, N1 and N2 are numbers of charge packets coupled to the measurement means during a first time interval and N3 and N4 are numbers of charge packets coupled to the measurement means during the second time interval.

15. A transmitter as recited in claim 14 wherein the quantity $(N1+N2) +(N4+N3/2^N)$ is controlled to a selected fixed value by the feedback means such that the output, is computed by counting.

16. A transmitter as recited in claim 1 wherein the transmitter is energized by a two-wire loop and provides a digital output to the loop.

17. A circuit for providing an output as a function of a sensed parameter, comprising:
generating means for providing a generator signal which is formed by a plurality of charge packets and which is a function of the sensed parameter, the generating means including reactance means for forming the charge packets;
measurement means for providing a measurement signal as a function of the generator signal;
comparator means for providing a comparator output indicating that the measurement signal has passed a first comparator threshold;
feedback means for providing a feedback signal to the generating means as a function of the comparator output to control the generator means such that the generator signal tends toward a charge-balanced state, the feedback means including means for altering a level of electrical excitation provided to the reactance means to vary sensitivity of the circuit to the sensed parameter; and
output means for providing an output signal as a function of a count of charge packets.

18. A measurement circuit for providing a measurement output as a function of a sensed parameter, comprising:
sensing means forming a number of charge packets having a first polarity and a number of charge packets having a second polarity opposite the first polarity, each of such packets comprising a quantity of charge, the quantity of charge in at least some of the packets being a function of the process variable and a level of electrical excitation;
intgrator means for receiving the charge packets and providing an integrator output representative of the quantities of charge received;
control means for controlling the numbers of charge packets as a function of the integrator output such that the quantity of charge received by the integrator means is balanced;

excitation varying means for varying the level of electrical excitation to ary sensitivity of the circuit to the sensed parameter; and output means for providing an output as a function of the numbers of charge packets formed.

19. A measurement cirucit for providing a measurement output as a function of a sensed parameter, the circuit comprising:

means for providing an electrical excitation having a level which varies as a function of a control signal;

means for forming a plurality of charge packets having a first polarity and a plurality of charge packets having a second polarity opposite the first polarity, each of such packets comprising a quantity of charge, the quantity of charge in at least some of the packets being a function of the sensed parameter and the level of electrical excitation;

means for receiving the charge packets and providing an integrator output representative of an accumulated quantity of charge;

means for controlling numbers of charge packets formed as a function of the integrator output such that the accumulated quantity of charge tends to be balanced;

means for providing the control signal to vary the level of electrical exitation and thereby vary sensitivity of the circuit to the sensed parameter; and means for providing an output representative of the sensed parameter as a fucntion of numbers of charge packets formed.

20. A circuit for provding an output signal as a function of a sensed parameter, the circuit comprising:

reactance means for forming positive and negative charge packets, at least some of the charge packets having a quantity of charge which varies as a function of the sensed parameter;

means for storing charge from the charge packets;

means for altering polarity of the charge packets being provided to the means for storing when an amount of charge stored passes a threshold, so that quantities fo positive and negative charge provided to the means for storing tends toward a balanced state;

means for altering the level of electrical excitation to the reactance means to vary sensitivity of the circuit to the sensed parameter; and means for providing the output signal based upon a count of charge packets provided to the means for storing.

21. A circuit for providing an output signal which is a function of a sensed parameter, the circuit comprising:

means for forming positive and negative charge packets, at least some of the charge packets having a charge whose quantity is representative of the magnitude of the sensed parameter;

means for storing the charge contained in charge packets its receives;

means for selecting the charge packets to be provided to the means for storing so that over time no net charge accumulates in te means for storing;

means for altering a level of electrical excitation to the reactance means to vary sensitivity of the circuit to the sensed parameter;

means for counting numbers of charge packets provided to the means for storing; and mens for providing the output signal based upon at least one of the counted numbers of charge packets.

22. A method of providing an output signal which is a function of a sensed parameter, the method comprising:

during each of a plurality of measurement cycles:

forming first charge packets of first polarity having a charge which is a funciton of the sensed parameter and a first excitation level;

forming second charge packets of sensed opposite polarity having a charge which is a function of the first excitation level;

selectively transferring the first and second charge packets to a charge accumulator until a charge balance state is passed;

forming third charge packets of first polarity having a charge which is a function of the sensed parameter and a second, different excitation level;

forming fourth charge packets of second polarity having a charge which is a function of the second excitation level; and selectively transferring the third and fourth charge packets to the charge accumulator until the charge balance state is passed;

counting numbers of first, second, third and fourth charge packets which are transferred to the charge accumulator during a plurality of measurement cycles; and providing the output signal based on the counted numbers.

* * * * *

UNITED STATES PATENT AND TRADEMARK OFFICE
CERTIFICATE OF CORRECTION

PATENT NO. : 4,791,352

DATED : December 13, 1988

INVENTOR(S) : Roger L. Frick et al.

It is certified that error appears in the above-identified patent and that said Letters Patent is hereby corrected as shown below:

Col. 3, Line 16, delete "compriiing", and insert --comprising--.

Col. 11, Line 18, delete "inclduing", and insert --including--.

Col. 11, Line 31, delete "reciter", and insert --recited--.

Col. 11, Line 28, delete "exictation", and insert --excitation--.

Col. 11, Line 39, delete "claim 7", and insert --claim 5--.

Col. 11, Line 67, delete "tyhe", and insert --the--.

Col. 12, Line 28, delete the "," after output.

Col. 12, Line 64, delete "intgrator", and insert --integrator--.

Col. 13, Line 8, delete "cirucit", and insert --circuit--.

UNITED STATES PATENT AND TRADEMARK OFFICE
CERTIFICATE OF CORRECTION

PATENT NO. : 4,791,352

DATED : December 13, 1988

INVENTOR(S) : Roger L. Frick et al.

It is certified that error appears in the above-identified patent and that said Letters Patent is hereby corrected as shown below:

Col. 13, Line 4, delete "ary", and insert --vary--.

Col. 13, Line 30, delete "exitation", and insert --excitation--.

Col. 13, Line 33, delete "provding", and insert --providing--.

Col. 13, Line 46, delete "fo", and insert --of--.

Col. 14, Line 14, delete "te", and insert --the--.

Col. 14, Line 20, delete "mens", and insert --means--.

Signed and Sealed this

Twenty-fifth Day of July, 1989

Attest:

DONALD J. QUIGG

*Attesting Officer*      Commissioner of Patents and Trademarks